United States Patent
Hori et al.

(10) Patent No.: US 9,209,099 B1
(45) Date of Patent: Dec. 8, 2015

(54) POWER SEMICONDUCTOR MODULE

(71) Applicant: Fuji Electric Co., Ltd., Kanagawa (JP)

(72) Inventors: Motohito Hori, Nagano (JP); Yoshikazu Takahashi, Nagano (JP); Yoshinari Ikeda, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/695,276

(22) Filed: Apr. 24, 2015

(30) Foreign Application Priority Data

May 20, 2014 (JP) .................. 2014-104366

(51) Int. Cl.
- *H01L 31/0312* (2006.01)
- *H01L 23/043* (2006.01)
- *H01L 23/498* (2006.01)
- *H01L 23/492* (2006.01)
- *H01L 23/31* (2006.01)
- *H01L 23/00* (2006.01)

(52) U.S. Cl.
CPC .......... *H01L 23/043* (2013.01); *H01L 23/3107* (2013.01); *H01L 23/492* (2013.01); *H01L 23/49822* (2013.01); *H01L 24/17* (2013.01); H01L 2224/16113 (2013.01); H01L 2224/16227 (2013.01); H01L 2924/10272 (2013.01); H01L 2924/1203 (2013.01); H01L 2924/173 (2013.01); H01L 2924/1711 (2013.01); H01L 2924/1715 (2013.01)

(58) Field of Classification Search
CPC . H01L 31/0312; H01L 29/45; H01L 29/7802; H01L 29/66068
USPC ........................................... 257/77, 106, 181
See application file for complete search history.

(56) References Cited

U.S. PATENT DOCUMENTS

| 5,591,993 | A | 1/1997 | Nomura et al. |
| 5,629,562 | A | 5/1997 | Nomura et al. |
| 2005/0023670 | A1* | 2/2005 | Hata ................. H01L 23/49562 257/690 |
| 2011/0222717 | A1* | 9/2011 | Kuratani .............. H04R 19/005 381/355 |
| 2013/0127295 | A1* | 5/2013 | Jun ..................... H01L 41/1134 310/327 |
| 2014/0203306 | A1* | 7/2014 | Ito .......................... H01L 33/44 257/88 |

FOREIGN PATENT DOCUMENTS

| JP | H1-122146 A | 5/1989 |
| JP | H6-295965 A | 10/1994 |

(Continued)

OTHER PUBLICATIONS

U.S. Appl. No. 14/672,467, filed Mar. 30, 2015.

*Primary Examiner* — Phuc Dang
(74) *Attorney, Agent, or Firm* — Chen Yoshimura LLP

(57) ABSTRACT

A power semiconductor module is equipped with: a frame made of an insulator; a first electrode plate made of a metal and fixed to a bottom opening of the frame; semiconductor chips electrically and physically connected to the first electrode plate; a multilayer substrate fixed to a principal surface of the first electrode plate; wiring members that electrically connect front surface electrodes of the semiconductor chips and a circuit plate of the multilayer substrate; a second electrode plate fixed to a top opening of the frame; and a metal block that has a first surface having a projected portion and a second surface disposed on a side opposite to the first surface and that is tapered from the first surface to the second surface, the projected portion being electrically and physically connected to the circuit plate of the multilayer substrate and the second surface being electrically and physically connected to the second electrode plate.

11 Claims, 4 Drawing Sheets

(56) References Cited

FOREIGN PATENT DOCUMENTS

| JP | H7-312410 A | 11/1995 |
| JP | H10-294421 A | 11/1998 |
| JP | 2004-228403 A | 8/2004 |
| JP | 2007-287833 A | 11/2007 |
| JP | 2010-165764 A | 7/2010 |
| JP | 2012-74730 A | 4/2012 |
| JP | 2013-149762 A | 8/2013 |

* cited by examiner

POWER SEMICONDUCTOR MODULE

BACKGROUND OF THE INVENTION

1. Technical Field

The present invention relates to a power semiconductor module.

2. Background Art

Some flat semiconductor devices seek to achieve downsizing and reduced impedance of the wiring by connecting the electrodes to external circuits by pressure welding. Such flat semiconductor devices are described in Patent Document 1, for example.

FIG. 8 shows an example of a flat semiconductor device in a cross-sectional view. A power semiconductor module 101 is equipped with a metal electrode plate 102. Semiconductor chips 103 are electrically and physically connected on the electrode plate 102. In the illustrated example, the semiconductor chips 103 are power MOSFETs, and are provided in a plurality of units on the electrode plate 102. A drain electrode formed on the reverse surface of each of the semiconductor chips 103 is joined to the electrode plate 102 by a joining material not shown in the diagram, such as solder.

In addition to the semiconductor chips 103, a multilayer substrate 104 is joined on the electrode plate 102. The multilayer substrate 104 is constituted by: an insulating plate 141, a metal plate 142, and a circuit plate 143. The metal plate 142 is provided on one surface of the insulating plate 141 and joined to the multilayer substrate by a joining material not shown in the diagram, such as solder. The circuit plate 143 is provided on the other surface of the insulating plate 141 and forms prescribed circuits.

Additionally, the bottom surface of a metal block 110 is electrically and physically connected to the circuit plate 143 of the multilayer substrate 104. The top surface of the metal block 110 protrudes out of a cover 111, and also serves as an electrode of the power semiconductor module 101. The semiconductor chips 103 and the multilayer substrate 104 are sealed by a sealing material 108, such as a thermosetting resin.

In order to electrically connect the semiconductor chip 103 and the multilayer substrate 104, a source electrode formed on the front surface of the semiconductor chip 103 is connected to the circuit plate 143 by bonding wiring 107. Additionally, a gate electrode formed on the front surface of the semiconductor chip 103 is connected to the circuit plate 143 by the bonding wiring 107.

The power semiconductor module 101 shown in FIG. 8 is not independently insulated from the outside, and therefore requires a device on which the power semiconductor module 101 is installed to provide an insulating function to the power semiconductor module 101. In other words, the power semiconductor module 101 is a non-insulated power semiconductor module.

When current is passed through the conventional power semiconductor module 101, heat generated from the semiconductor chips 103 is predominantly dissipated through the electrode plate 102. The reason for this is that heat dissipation from the front surfaces of the semiconductor chips 103 on the side opposite to the electrode plate 102 contributes very little to the overall heat dissipation, due to the large thermal resistance of the sealing material 108 and the bonding wiring 107. This has limited the extent to which heat is dissipated from the semiconductor chips 103.

Flat type welding structure packages are designed to establish a contact between an electrode layer on the top surface of a semiconductor element provided on a substrate and a contact terminal. In one such flat type welding structure package, a thermal stress mitigating member is inserted between the contact terminal and the semiconductor element (Patent Document 2). The power semiconductor module described in Patent Document 2 is able to dissipate heat generated by the semiconductor element from not only the substrate but also the contact terminal, and is therefore considered to be more advanced than the power semiconductor module of Patent Document 1.

However, with respect to the power semiconductor module described in Patent Document 2, linear load from the contact terminal is exerted on the semiconductor element when the power semiconductor module is undergoes pressure welding, thus posing the risk that excessive load may be applied to the semiconductor element.

RELATED ART DOCUMENTS

Patent Documents

Patent Document 1: Japanese Patent Application Laid-Open Publication H1-122146

Patent Document 2: Japanese Patent Application Laid-Open Publication 2013-149762

SUMMARY OF THE INVENTION

The present invention aims to effectively solve the problems described above. The objective of the present invention is to provide a power semiconductor module capable of effectively dissipating heat from the top and bottom electrodes, while preventing excessive load from being applied to the semiconductor chip when the power semiconductor module is used.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power semiconductor module, including: a frame made of an insulator and having a bottom opening and a top opening; a first electrode plate made of a metal and fixed in the bottom opening in the frame; a semiconductor element having a front surface electrode and a reverse surface electrode, the reverse surface electrode being electrically and physically connected to a principal surface of the first electrode plate; a multilayer substrate comprising a circuit plate, an insulating plate, and a metal plate stacked together, the metal plate being fixed to the principal surface of the first electrode plate; a wiring member that electrically connects the front surface electrode of the semiconductor element to the circuit plate of the multilayer substrate; a second electrode plate made of a metal and fixed in the top opening in the frame; and a metal block that has a first surface having a protrusion and a second surface opposite thereto and that tapers from the first surface to the second surface, the protrusion being electrically and physically connected to the circuit plate of the multilayer substrate, and the second surface of the metal block being electrically and physically connected to the second electrode plate.

According to the power semiconductor module in one aspect of the present invention, since the metal block is tapered, heat can be dissipated from the front surfaces of the semiconductor chips via the metal block. Additionally, the power semiconductor module is capable of preventing a linear load from being applied to the semiconductor chips, thereby achieving a reliable power semiconductor module.

It is to be understood that both the foregoing general description and the following detailed description are exemplary and explanatory, and are intended to provide further explanation of the invention as claimed.

DETAILED DESCRIPTION OF EMBODIMENTS

Embodiments of the power semiconductor module of the present invention will be described below in detail with reference to diagrams. Note that the expression, "electrically and physically connected," used in the description of this application is not limited to cases where the applicable objects are directly connected to each other, but also includes cases where the applicable objects are connected via conductive materials such as solder or metal sintering materials.

Embodiment 1

Figure 1:
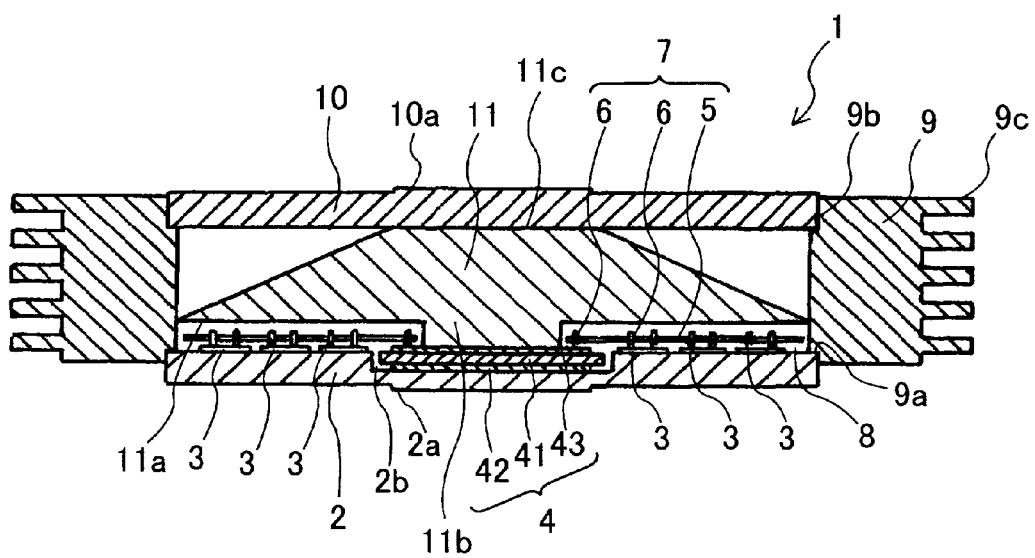
FIG. 1 is a cross-sectional view of a power semiconductor module of Embodiment 1 of the present invention.
Figure 6A:
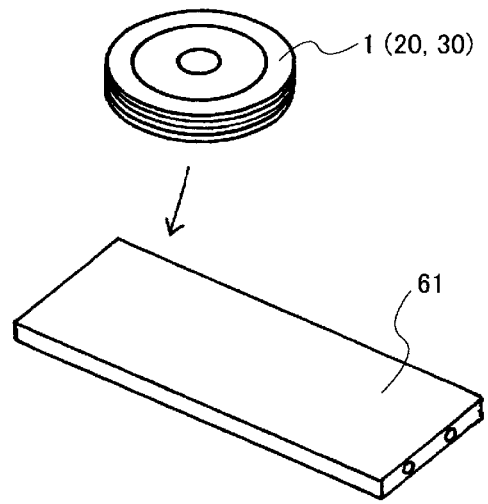
FIGS. 6A to 6C are perspective views for describing a power semiconductor module of Embodiment 4 of the present invention.

A power semiconductor module 1 of Embodiment 1 of the present invention, shown as a cross-sectional view in FIG. 1, has a substantially cylindrical outer shape (see FIG. 6A). The power semiconductor module 1 is equipped with: a frame 9; a first electrode plate 2; semiconductor chips 3 that serve as semiconductor elements; a multilayer substrate 4; wiring members 7; a second electrode plate 10; and a metal block 11. The first electrode plate 2 is an electrode that is pressure welded to an external conductive plate to pass current when the power semiconductor module 1 of the present embodiment is used. The first electrode plate 2 has a projected portion 2a at the center of the outer surface so as to be aligned with an external conductive plate. The projected portion 2a with a height of approximately 1 mm can secure sufficient contact.

The semiconductor chips 3 are fixed on a principal surface of the first electrode plate 2. The semiconductor chip 3 has a front electrode and a reverse electrode. In the present embodiment, the semiconductor chip 3 is a diode chip. Note, however, that this does not exclude the possibility of employing a switching element such as an IGBT (Insulated Gate Bipolar Transistor) or a power MOSFET for the semiconductor chip 3. A semiconductor element made of silicon carbide (SiC) or silicon is employed for the semiconductor chip 3. A semiconductor element made of silicon carbide is especially preferable, since such a semiconductor element has a wide band gap and high heat resistance, which allows for high-temperature operation.

FIG. 1 shows six semiconductor chips 3 in total, or three semiconductor chips 3 respectively on the left and right sides of the page, with the multilayer substrate 4 therebetween. In addition to those shown in the diagram, a plurality of semiconductor chips 3 are provided around the multilayer substrate 4. The reverse surface electrode (anode electrode, for example) of the semiconductor chip 3 is electrically and physically connected to the first electrode plate 2 by a conductive joining material not shown in the diagram, such as solder or a metal sintering material.

As shown in FIG. 1, the multilayer substrate 4 is configured by stacking together a circuit plate 43, an insulating plate 41, and a metal plate 42. The insulating plate 41 is an insulating plate made of an insulating ceramic, such as aluminum nitride or aluminum oxide, for example, and the metal plate 42 and the circuit plate 43 are made of copper, for example. A DCB (Direct Copper Bond) substrate or the like formed by directly joining the insulating plate 41, the metal plate 42, and the circuit plate 43 can be used as the multilayer substrate 4. In addition, the multilayer substrate 4 can be configured by joining the circuit plate 43 and the metal plate 42 to the insulating plate 41 using a joining material not shown in the diagram. The metal plate 42 of the multilayer substrate 4 is in contact with a principal surface of the first electrode plate 2, and is fixed to the first electrode plate 2 with a joining material not shown in the diagram.

The wiring members 7 face ends of the multilayer substrate 4, as well as the semiconductor chips 3. The wiring member 7 electrically connects a front surface electrode (a cathode electrode, for example) of the semiconductor chip 3 and the circuit plate 43 of the multilayer substrate 4.

The wiring member 7 is equipped with a printed board 5 and conductive posts 6. The printed board 5 has, on at least one surface of an insulating plate thereof, a metal film for wiring made of a conductive metal such as copper or aluminum. It is preferable that copper be used for the metal film to achieve low inductance. If the semiconductor chip 3 is a switching element and has a plurality of front surface electrodes on the front surface of the semiconductor chip 3, the printed board 5 has at least two types of metal films for wiring to accommodate these electrodes.

The insulating plate of the printed board 5 may be a rigid substrate made of a glass epoxy material, a flexible substrate made of a polyimide material, or a ceramic substrate. The metal film of the printed board 5 can be formed on one surface of the insulating plate, or on both surfaces.

One end of the conductive post 6 is electrically and physically connected to the metal film of the printed board 5 by a conductive joining material such as solder (not shown in the diagram). The other end of the conductive post 6 is electrically and physically connected to the front surface electrode of the semiconductor chip 3 or the circuit plate 43 by a conductive joining material such as solder (not shown in the diagram).

The conductive post 6 is made of a metal material with good conductivity, such as copper. Additionally, metal plating can be applied to the surface, if needed. The outer shape of the conductive post 6 can be a cylinder, a cuboid, or the like. Note that the bottom surface of the conductive post 6 must be smaller than the front surface electrode of the semiconductor chip 3. The diameter of the conductive post 6 is approximately 0.5 mm, for example.

Further, any number of conductive posts 6 can be installed on each of the semiconductor chips 3, and it is also possible to join a plurality of conductive posts 6 to one electrode.

Figure 8:
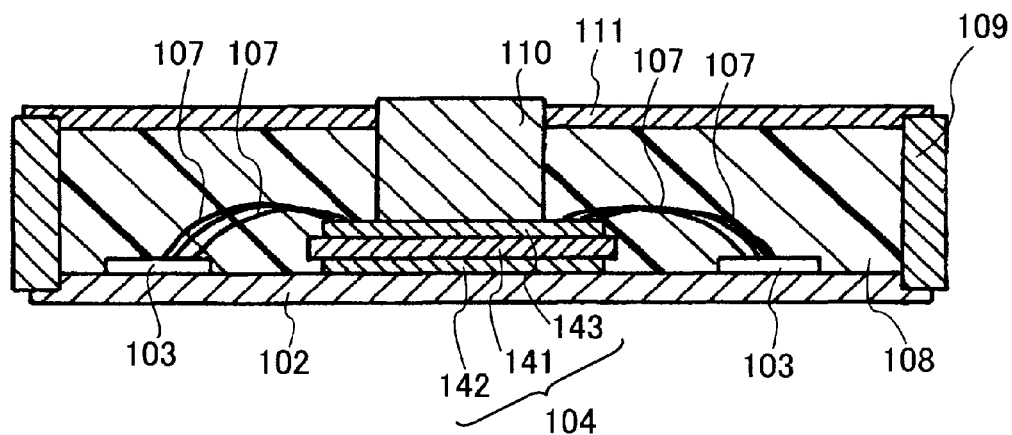
FIG. 8 is a cross-sectional view of a conventional power semiconductor module.

In other words, the power semiconductor module 1 of the present embodiment is configured with the wiring members 7 equipped with the printed boards 5 and the conductive posts 6 in lieu of the bonding wiring 107 used in the conventional power semiconductor module 101 shown in FIG. 8.

The wiring members 7 allow the cross section of the wiring to be thicker than the bonding wiring 107. Additionally, the length of wiring can be shortened. For these reasons, with the power semiconductor module 1 of the present embodiment, it is possible to lower inductance than with the conventional power semiconductor module 101. For the same reasons, it is possible to realize a larger current flow in the semiconductor chips and an increase in current density. Further, the wiring members 7 are superior to the bonding wiring with respect to heat dissipation from the semiconductor chips 3.

Additionally, since the wiring members 7 are physically connected to the semiconductor chips 3 using a joining material, the wiring members 7 are adhered more securely to the semiconductor chips 3 than the bonding wiring and are therefore more resistant to thermal stress. This makes it possible to enhance the reliability of the power semiconductor module 1.

Further, the wiring members 7 can reduce the height or the amount of the sealing material 8 filled inside the enclosure than the bonding wiring 107 can. This makes it possible to lower the cost of the power semiconductor module 1, and enhance the reliability thereof.

The power semiconductor module 1 uses the wiring members 7, each of which is formed by joining the printed board 5 and the conductive posts 6 into an integral whole, thereby allowing easy assembly and simplifying the steps of manufacturing the power semiconductor module 1.

The wiring members 7 are sealed by a sealing material 8 made of a thermosetting resin. It is preferable that the amount of the sealing material 8 injected into the enclosure be an amount that covers up to approximately 1 to 3 mm, most preferably 2 mm, above the top ends of the printed boards 5 and the conductive posts 6 to ensure that the printed boards 5 and the conductive posts 6 are insulated.

A sealing material made of a thermosetting resin has a higher thermal resistance and pressure resistance than a sealing material made of gel, and is therefore preferable for the sealing material 8. Specifically, an epoxy resin can be used for the sealing material 8. Additionally, it is preferable that a sealing material made of a resin to which a filler with high heat conductivity is added be used, in order to increase heat dissipation. Aluminum, boron nitride, or the like may be employed as a filler, for example.

In the power semiconductor module 1 of the present embodiment, a recessed portion 2b is provided at the center of the surface of the first electrode plate 2. The multilayer substrate 4 is disposed in the recessed portion 2b to align the heights of the semiconductor chips 3 and the circuit plate 43. This is done so that conductive posts with the same length can be used for the conductive posts 6 of the wiring members 7, and so that the printed boards 5 can be disposed substantially parallel to the first electrode plate 2 and the multilayer substrate 4.

The frame 9 is a hollow cylinder, and has a bottom opening 9a to which the first electrode plate 2 is joined by an adhesive agent not shown in the diagram. Additionally, the second electrode plate 10 is joined to a top opening 9b of the frame 9 with an adhesive agent not shown in the diagram. A recessed and projected portion 9c is provided on the outer surface of the frame 9 of the present embodiment to secure a sufficient creepage distance in the event a high voltage is applied between the first electrode plate 2 and the second electrode plate 10.

The enclosure of the power semiconductor module 1 is constituted by the frame 9, the first electrode plate 2, and the second electrode plate 10, and houses the semiconductor chips 3, the multilayer substrate 4, the wiring members 7, and the metal block 11.

The second electrode plate 10 is an electrode that is pressure welded to an external conductive plate to pass current when the power semiconductor module 1 of the present embodiment is used, in a manner similar to the first electrode plate 2. The second electrode plate 10 has a projected portion 10a at the center of the outer surface, so as to be aligned with an external conductive plate. The projected portion 10a with a height of approximately 1 mm can ensure sufficient contact.

The metal block 11 is provided to allow current to flow from the multilayer substrate 4 to the second electrode plate 10 inside the enclosure. The metal block 11 is made of a metal material with good heat conductivity and electrical conductivity, such as copper. Additionally, a projected portion 11b is provided on a first surface 11a of the metal block 11. The projected portion 11b is connected electrically and physically to the circuit plate 43 of the multilayer substrate 4 by a conductive joining material not shown in the diagram, such as solder. Further, a second surface 11c of the metal block 11 is electrically and physically connected to the second electrode plate 10 by a joining material such as solder, screws, or the like.

The first surface 11a of the metal block 11 is adhered to the sealing material 8, which covers the printed boards 5 and the conductive posts 6. The metal block 11 and the semiconductor chips 3 are in close proximity to each other, with the sealing material 8 and the wiring members 7 therebetween. In addition, the second surface 11c of the metal block 11 and the multilayer substrate 4 are roughly equal in size. It follows then that the metal block 11 tapers from the first surface 11a to the second surface 11c. More specifically, the metal block 11 of the present embodiment shown in FIG. 1 is a conical frustum provided with the projected portion 11b on the bottom surface.

Figure 2:
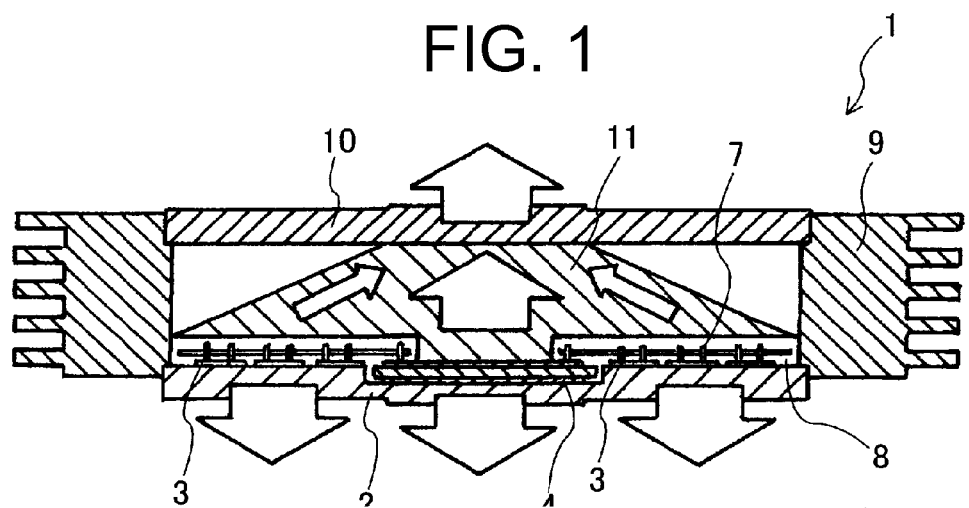
FIG. 2 is a cross-sectional view showing paths in which heat is dissipated in the power semiconductor module of FIG. 1.

The first surface 11a of the metal block 11 is positioned immediately above the semiconductor chips 3, and is in close proximity with the semiconductor chips 3 with the sealing material 8 and the wiring member 7 therebetween. For this reason, heat generated by the semiconductor chips 3 is transferred to the metal block 11 via the sealing material 8 and the wiring members 7. As heat is transferred from the semiconductor chips 3 to the second electrode plate 10 via the metal block 11, heat can be dissipated to the outside. Using arrows, FIG. 2 shows paths in which heat is dissipated from the semiconductor chips 3 in the present embodiment. As shown in FIG. 2, heat is dissipated from not only the first electrode plate 2, to which the semiconductor chips 3 are joined, but also from the second electrode plate 10 via the metal block 11, as described above. As a result, it is possible to achieve better heat dissipation than in the past.

It is preferable that the distance between the metal block 11 and the semiconductor chips 3 be as small as possible, so that heat can be efficiently dissipated to the outside via the metal block 11. In the power semiconductor module 1 of the present embodiment, the amount of the sealing material 8 inside the enclosure is kept to a minimum amount required to sufficiently insulate the conductive posts 6 and the printed boards 5, so that the metal block 11 and the semiconductor chips 3 can be placed as close to each other as possible. Furthermore, the height of the wiring members 7 of the present embodiment can be lower than the conventional bonding wiring; this makes it possible to place the metal block 11 and the semiconductor chips 3 even closer to each other.

Figure 3:
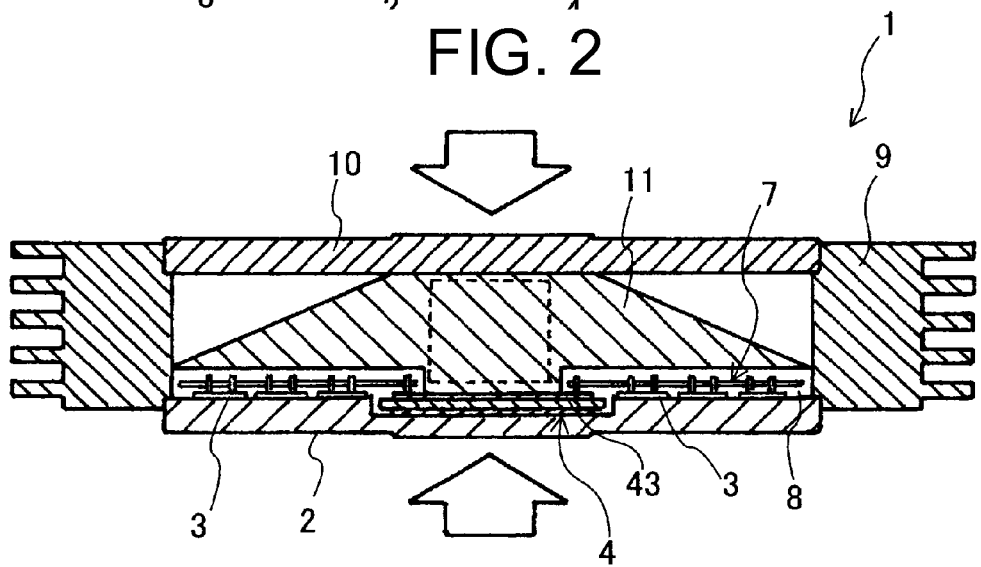
FIG. 3 is a cross-sectional view showing directions of load application in the power semiconductor module of FIG. 1.

The size of the second surface 11*c* of the metal block 11 is roughly equal to the size of the surface of the circuit plate 43 of the multilayer substrate 4, for example. Using arrows, FIG. 3 shows the directions of load applied when the power semiconductor module 1 is pressure welded to external conductive plates. With respect to the metal block 11, load is primarily supported by an area surrounded by the dashed line between the second surface 11*c* and the projected portion 11*b* of the first surface 11*a*, as shown in FIG. 3. In other words, it is made less likely that load will apply to the semiconductor chips 3, which are placed farther away from the area surrounded by the dashed line. According to the present embodiment, therefore, it is possible to prevent excessive load from being applied to the semiconductor chips 3.

The metal block 11 is shaped in a conical frustum, so as to allow the semiconductor chips 3 to dissipate heat while making it less likely that load will apply to the semiconductor chips 3. Note, however, that the shape of the metal block 11 is not limited to a conical frustum in the power semiconductor module of the present invention. Various modifications are possible, provided that the metal block 11 is tapered from the first electrode plate to the second electrode plate 10, so as to allow the semiconductor chips 3 to dissipate heat while making it less likely that load will apply to the semiconductor chips 3. For example, if the enclosure of the power semiconductor module is a cuboid, the metal block 11 can be a quadrangular pyramid to fit the outer shape of the enclosure.

Embodiment 2

Figure 4:
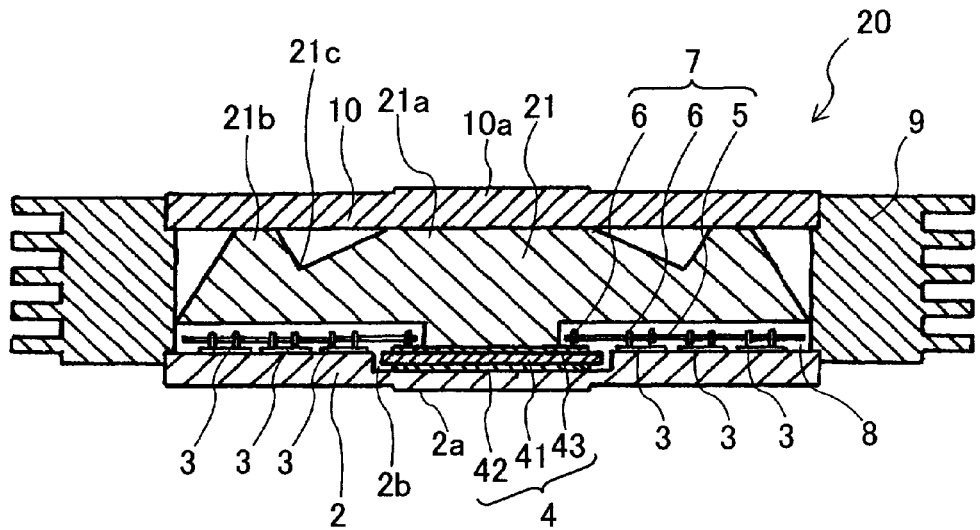
FIG. 4 is a cross-sectional view of a power semiconductor module of Embodiment 2 of the present invention.

FIG. 4 is a cross-sectional view of a power semiconductor module 20 of Embodiment 2 of the present invention. Components that are identical to the components of the power semiconductor module 1 of Embodiment 1 shown in FIG. 1 are given identical reference characters in FIG. 4, and duplicate descriptions will be omitted below.

A metal block 21 of the power semiconductor module 20 in FIG. 4 is a combination of a conical frustum 21*a* at the center and conical frustums 21*b* on the peripheral sides, and is connected to a second electrode plate 10 at a plurality of points. All other structures are identical to the structures of the power semiconductor module 1 shown in FIG. 1. Since the metal block 21 is in contact with the second electrode plate 10 at a plurality of points, heat dissipation from semiconductor chips 3 is better with the metal block 21 than with the metal block 11 shown in FIG. 1. Additionally, the metal block 21 has trough portions 21*c* between the conical frustum 21*a* at the center and the conical frustums 21*b* on the peripheral sides. The low rigidity of these portions makes it less likely that load will apply to the semiconductor chips 3. As a result, the metal block 21 in FIG. 4 also allows heat dissipation from the semiconductor chips 3 while making it less likely that load will apply to the semiconductor chips 3.

Embodiment 3

Figure 5:
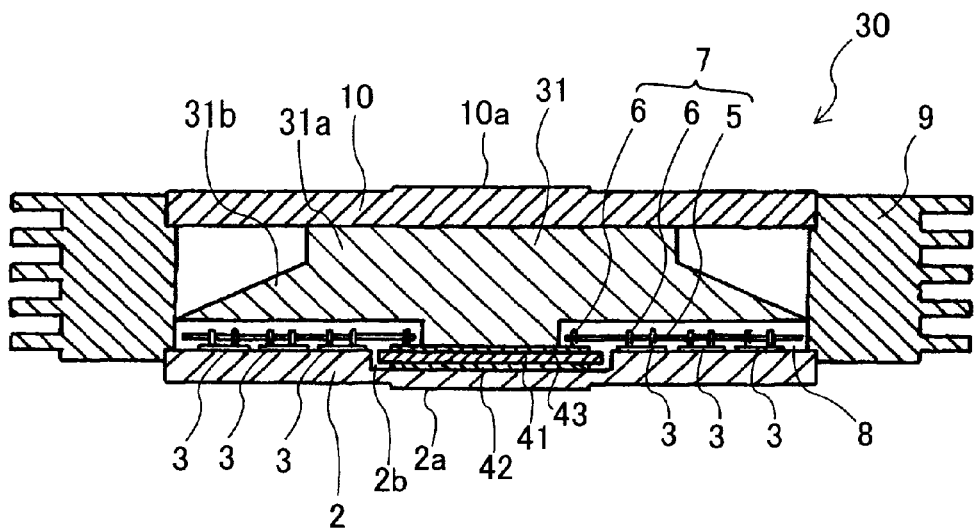
FIG. 5 is a cross-sectional view of a power semiconductor module of Embodiment 3 of the present invention.

FIG. 5 shows a cross-sectional view of a power semiconductor module 30 of Embodiment 3 of the present invention. Components that are identical to the components of the power semiconductor module 1 of Embodiment 1 shown in FIG. 1 are given identical reference characters in FIG. 5, and duplicate descriptions will be omitted below.

A metal block 31 of the power semiconductor module 30 in FIG. 5 is a combination of a cylinder 31*a* and conical frustums 31*b*. All other structures are identical to the structures of the power semiconductor module 1 shown in FIG. 1. The metal block 31 in FIG. 5 also allows heat dissipation from semiconductor chips 3 while making it less likely that load will apply to the semiconductor chips 3.

Embodiment 4

Figure 6B:
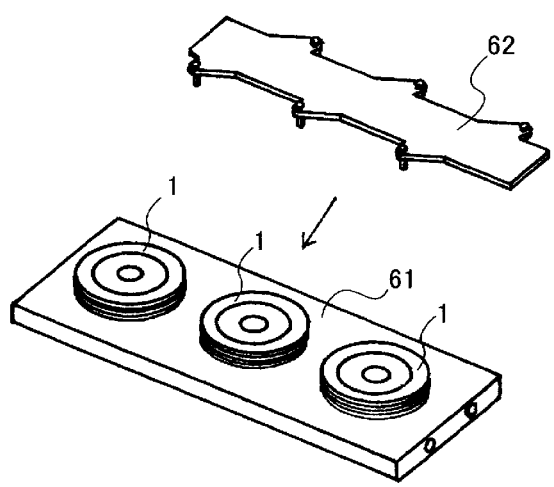
Figure 6C:
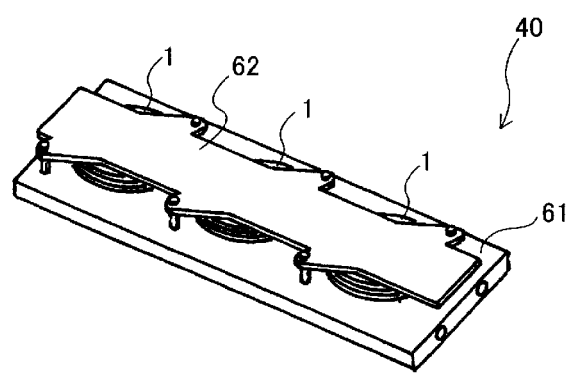

Embodiment 4 of the power semiconductor module of the present invention will be described using FIGS. 6A to 6C. First, a plurality of power semiconductor modules 1, 20, or 30 of Embodiments 1 to 3 are prepared, and a cooling plate 61 on which such power semiconductor modules can be mounted is prepared (FIG. 6A). Next, the power semiconductor modules 1 (or 20 or 30) (three units in FIGS. 6B to 6C) are mounted on the cooling plate 61. Additionally, an external electrode 62, to which second electrode plates 10 of the mounted power semiconductor modules 1 (or 20 or 30) are electrically and physically connected, is prepared (FIG. 6B). Then, by installing the external electrode 62 on the power semiconductor modules 1 (or 20 or 30) by pressure welding, a power semiconductor module 40 (FIG. 6C) is formed. Since the power semiconductor module 40 is formed by connecting three units of the power semiconductor modules 1 (or 20 or 30) in parallel, the rated current can be increased more than with one unit of the power semiconductor module 1 (or 20 or 30).

Embodiment 5

Figure 7:
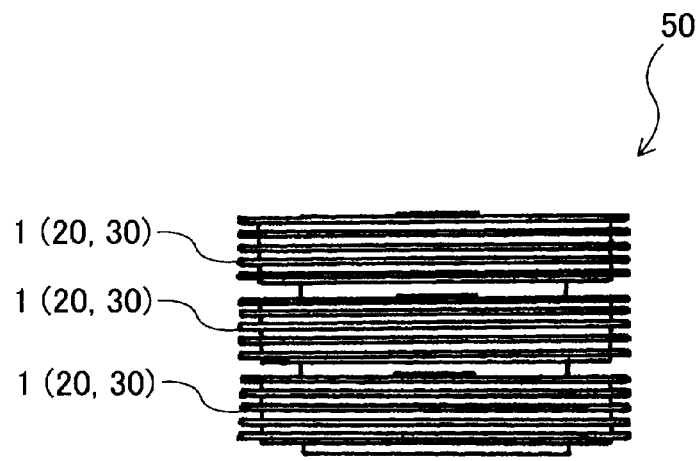
FIG. 7 is a front view of a power semiconductor module of Embodiment 5 of the present invention.

Embodiment 5 of the power semiconductor module of the present invention will be described using FIG. 7. A power semiconductor module 50 is formed by stacking and pressure welding a plurality (three in the illustrated example) of power semiconductor modules 1, 20, or 30 of Embodiments 1 to 3. The power semiconductor modules are connected in series to form one power semiconductor module 50. Since the power semiconductor module 50 shown in FIG. 7 is formed by connecting three units of power semiconductor modules 1 (or 20 or 30) in parallel, the rated current can be increased more than with one unit of the power semiconductor module 1 (or 20 or 30).

The power semiconductor module according to various aspects of the present invention has been described in detail above using diagrams and embodiments, but the present invention is not limited to the above embodiments and diagrams, and can be implemented by appropriately modifying the above embodiments without departing from the spirit thereof.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A power semiconductor module, comprising:
a frame made of an insulator and having a bottom opening and a top opening;
a first electrode plate made of a metal and fixed in the bottom opening in said frame;
a semiconductor element having a front surface electrode and a reverse surface electrode, said reverse surface electrode being electrically and physically connected to a principal surface of said first electrode plate;

a multilayer substrate comprising a circuit plate, an insulating plate, and a metal plate stacked together, said metal plate being fixed to the principal surface of said first electrode plate;

a wiring member that electrically connects the front surface electrode of said semiconductor element to the circuit plate of said multilayer substrate;

a second electrode plate made of a metal and fixed in the top opening in said frame; and a metal block that has a first surface having a protrusion and a second surface opposite thereto and that tapers from said first surface to said second surface, said protrusion being electrically and physically connected to the circuit plate of said multilayer substrate, and said second surface of the metal block being electrically and physically connected to said second electrode plate.

2. The power semiconductor module according to claim 1, wherein the first surface of said metal block faces said semiconductor element with a sealing material therebetween.

3. The power semiconductor module according to claim 2, wherein the wiring member further comprises:

a printed board having a metal film and facing said semiconductor element and said multilayer substrate; and a plurality of conductive posts, one end of each of said conductive posts being electrically and physically connected to said front surface electrode of said semiconductor element or said circuit plate of said multilayer substrate, and another end of each of said conductive posts being electrically and physically connected to said metal film of said printed board.

4. The power semiconductor module according to claim 3, wherein the sealing material is made of a thermosetting hard resin, a height of said sealing material being 1 to 3 mm from a top end of said printed board and said conductive posts.

5. The power semiconductor module according to claim 1, wherein said metal block has a conical frustum shape.

6. The power semiconductor module according to claim 1, wherein said metal block is formed by combining a plurality of conical frustum shapes.

7. The power semiconductor module according to claim 1, wherein said first electrode plate has a recess in the principal surface and said multilayer substrate is disposed in said recess.

8. The power semiconductor module according to claim 1, wherein said first electrode plate and said second electrode plate have protrusions that project outward.

9. The power semiconductor module according to claim 1, wherein said frame has recesses and protrusions on an outer surface thereof.

10. The power semiconductor module according to claim 1, wherein said semiconductor element is made of silicon carbide.

11. The power semiconductor module according to claim 1, wherein said semiconductor element is a diode.

* * * * *